(12) United States Patent
Rysinski et al.

(10) Patent No.: US 7,920,024 B2
(45) Date of Patent: Apr. 5, 2011

(54) APPARATUS AND METHODS PROVIDING DYNAMIC BIASING OF CASCODE TRANSISTORS IN CLASS AB AMPLIFIERS

(75) Inventors: Jeffrey Rysinski, Boise, ID (US); Sanjayan Vinayagamoorthy, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 1388 days.

(21) Appl. No.: 11/404,833

(22) Filed: Apr. 17, 2006

(65) Prior Publication Data

US 2007/0242146 A1 Oct. 18, 2007

(51) Int. Cl.
*H03F 3/45* (2006.01)

(52) U.S. Cl. ........................................ 330/253; 330/255

(58) Field of Classification Search .................. 330/253, 330/255; 345/204
See application file for complete search history.

(56) References Cited

U.S. PATENT DOCUMENTS 6,128,039 A * 10/2000 Chen et al. ..................... 348/294
7,470,556 B2 * 12/2008 Boettiger et al. ............... 438/48

OTHER PUBLICATIONS

Callewaert et al., "Class AB CMOS Amplifiers with High Efficiency", IEEE Journal of Solid-State Circuits, vol. 25, No. 3, Jun. 1990, pp. 684-691.

* cited by examiner

*Primary Examiner* — Robert Pascal
*Assistant Examiner* — Khiem D Nguyen

(57) ABSTRACT

An amplifier and method of fabricating and operating it are disclosed in which dynamically biased cascode transistors are provided in an output stage along with output transistors which are dynamically biased by differential control circuits to provide an output signal.

12 Claims, 5 Drawing Sheets

US 7,920,024 B2

APPARATUS AND METHODS PROVIDING DYNAMIC BIASING OF CASCODE TRANSISTORS IN CLASS AB AMPLIFIERS

FIELD OF THE INVENTION

The present invention relates to class AB amplifiers, particularly to an improved output stage for such amplifiers.

BACKGROUND OF THE INVENTION

Class AB amplifiers are well known devices and have many and varied uses. One such use is as a voltage source for switching circuits where a large amount of current is required during signal transition periods, but only a small current is required during steady state operation. Such amplifiers have found particular utility in providing a source voltage in CMOS integrated circuit designs.

One such class AB CMOS amplifier is described in the article entitled "Class AB CMOS Amplifiers With High Efficiency" by Callewaert et al., IEEE Journal of Solid-State Circuits, Vol. 25, No. 3, June 1990. This amplifier 51, which is reproduced in FIG. 1, has an output p-channel Q30 and n-channel Q27 transistors serially connected across voltage supply terminals 23, 25, with an output 21 being taken at the interconnection of the two transistors. The transistors Q27, Q30 are gate biased by respective differential amplifier stages 11, 15 and associated current sum branches 13, 17 through gate control signals developed at circuit nodes n2 and p4.

One exemplary use of the amplifier 51 is illustrated in FIG. 2 where amplifier 51 applies an output voltage to bias capacitors 43 and 45 of a sample-and-hold circuit 52 of a solid state CMOS imager device which reads output signals from pixels 31 arranged in an array of pixel rows and columns. The sample-and-hold circuit 52 is typically connected to a column line 35 to which is connected a plurality of pixel circuits 31 in parallel in respective rows of the pixel array. Column line 35 is coupled to a current source 41. Typically two output signals are provided by each pixel 31, a reset signal Vrst, and a signal Vsig representing incident light. These signals are respectively sampled through sample-and-hold switches 37 and 39 controlled by control signals SHR and SHS, respectively, to sample the reset signal Vrst on capacitor 43 and the light intensity signal Vsig on capacitor 45.

Prior to the sampling operation, clamping switches 47 and 49 are closed, and a clamping voltage provided by the class AB amplifier 51 is supplied to the back side of the capacitors. A clamp switch 48 is also typically provided for equalizing the voltages supplied to the capacitors 43, 45. After switches 47, 49, and 48 are closed to provide a voltage onto the back side of capacitors 43 and 45, the switches are then opened. The Vrst signal is sampled onto the capacitor 43 and the Vsig signal is sampled onto the capacitor 45. These signals are then respectively provided to positive and negative inputs of operational amplifier 53, and then to one or more amplifier stages 55, and finally to an analog-to-digital converter stage 57 where a differential analog signal Vrst−Vsig representing the amount of incident light on a pixel is digitized and used for image processing. It should be appreciated that there are many column lines in a CMOS imager, and that FIG. 2 represents the circuitry associated with one column line, or circuitry which can be multiplexed among a plurality of column lines to provide Vrst and Vsig signals for the various pixels in a pixel array.

As further shown in FIG. 2, class AB amplifier 51 has its output 21 fed back to a negative input, while the positive input receives a reference voltage Vref. This amplifier generally provides a very good output voltage during both transient periods and steady state operation. However, its operation is somewhat limited by the maximum possible gain which can be obtained, and the amplifier output is also sensitive to power supply noise. Power supply noise is a particular problem in digital imaging circuits, as the signal levels which are provided by pixels 31 are relatively low signal levels, so any noise in the output provided by class AB amplifier 51 to the back sides of capacitors 43 and 45 could affect the level of signal read by the sample-and-hold circuit 52 and provided ultimately to the analog-to-digital converter 57. Accordingly, an improved class AB amplifier having lower noise and improved gain is desired.

DETAILED DESCRIPTION OF THE INVENTION

The present invention provides an amplifier and methods of fabricating and operating the same, in which the amplifier employs cascode transistors in an output stage which provides a voltage signal for analog and digital circuits. The cascode transistors are dynamically biased in accordance with operation of differential amplifier stages and associated current sum stages employed in the amplifier.

These and other features and advantages of the invention will be better understood from the following detailed description which is provided in connection with the accompanying drawings.

Figure 3:
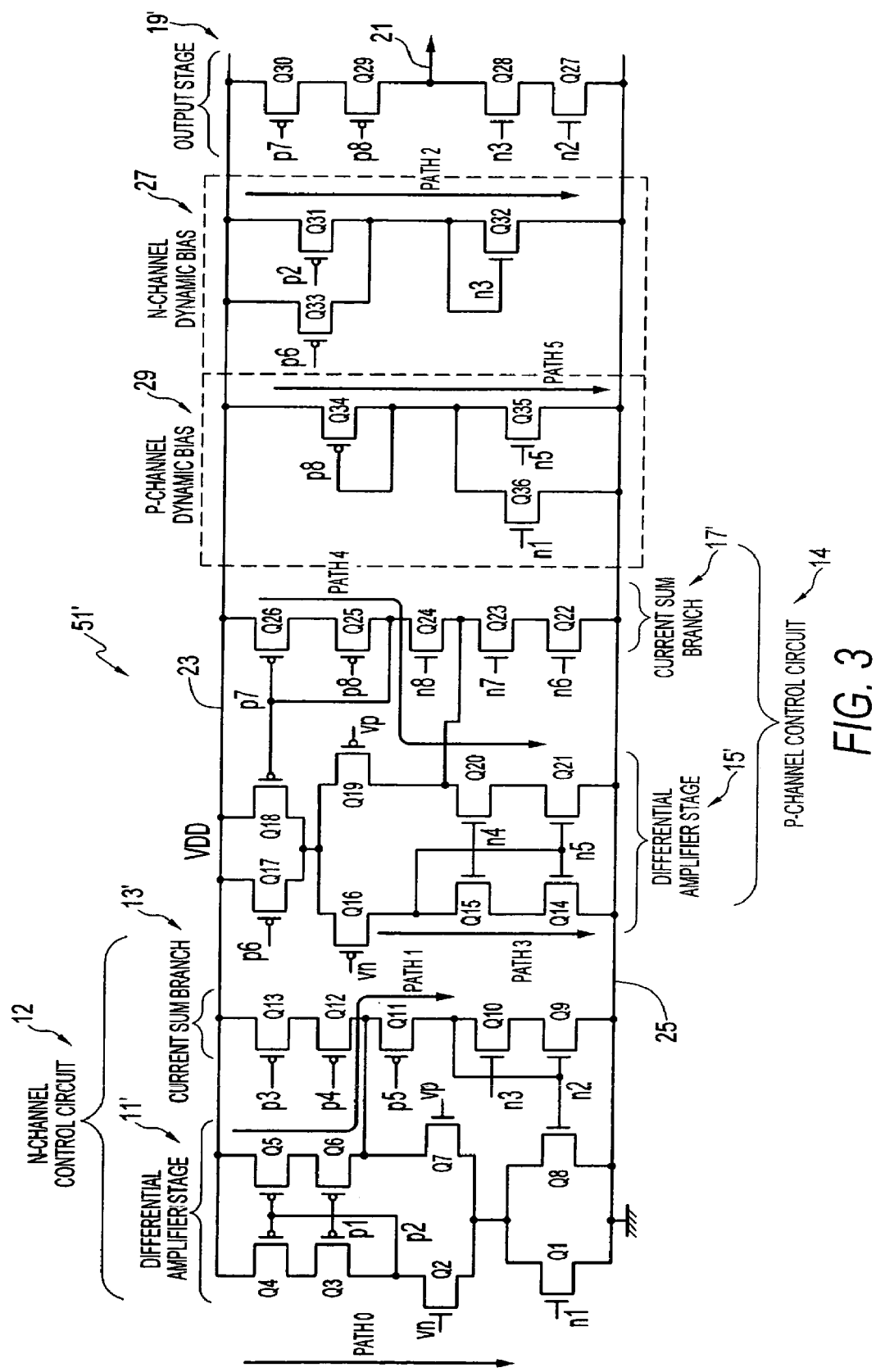
FIG. 3 is an electrical schematic diagram illustrating one exemplary embodiment of the invention.

FIG. 3 illustrates an exemplary embodiment of the invention. An output stage 19' is provided which has p-channel Q30 and N-channel Q27 output transistors. In addition, p-channel and n-channel cascode transistors are also provided in the output stage 19' as Q28 and Q29. The four transistors Q27, Q28, Q29, and Q30 are serially connected across voltage supply terminals 23 and 25, which are typically connected to source voltage VDD and ground respectively. An output terminal 21 is provided at the connection point between the p-channel and n-channel cascode transistors 29 and 28.

N-channel output transistor Q27 is controlled by a first differential amplifier stage 11' and associated current sum branch 13' which provide an output control signal to transistor Q27 at a gate node n2. The differential amplifier stage 11' comprises a pair of p-channel differential transistors Q4 and Q5 respectively serially connected to a pair of cascode p-channel transistors Q3 and Q6. The p-channel transistors Q3 and Q6 are respectively serially connected to a pair of n-channel transistors Q2 and Q7 arranged as differential input transistors for respectively receiving input signals vn and vp. The two differential input n-channel transistors Q2 and Q7 are in turn coupled together at a source/drain connection point which in turn is connected to a source/drain coupled connection of n-channel bias transistors Q1 and Q8. The transistor pairs Q4 and Q5, Q3 and Q6, Q2 and Q7, Q1 and Q8, are connected across the supply voltage terminals 23 and 25. A node n1 provided at the gate of transistor Q1 provides a fixed bias set point for the differential amplifier stage 11', and another dynamic bias set point is provided at an input gate node n2 to transistor Q8. As noted, the node n2 is also coupled to the gate of transistor Q27 and provides output control for transistor Q27. The differential amplifier stage 11' also includes an interconnection between the commonly connected gates of p-channel transistors Q4 and Q5 to the source/drain serial connection point of transistors Q3 and Q2. This connection also provides a dynamic bias point p2 which will be described later. A fixed bias point p1 is also provided at the interconnected gates of transistors Q3 and Q6.

As noted, differential amplifier stage 11' has an associated current sum branch 13' which comprises serially source/drain connected p-channel transistors Q13, Q12, Q11, and n-channel transistors Q10 and Q9. The serial connection of the three p-channel and two n-channel transistors is also provided across source voltage terminals 23 and 25. The interconnection between p-channel transistors Q11 and Q12 is coupled to the interconnection between the differential amplifier stage 11' transistors Q6 and Q7. The interconnection between the current sum branch p-channel transistor Q11 and n-channel transistor Q10 is further connected to the gate bias node n2 of the gate connected transistors Q8 and Q9, and also to gate of the output transistor Q27 as described above.

The gate bias nodes p3, p4, p5 respectively associated with p-channel transistors Q13, Q12 and Q11 receive a fixed bias potential. N-channel transistor Q10 receives a dynamic bias potential n3 at its gate from an n-channel dynamic bias path 27 which will be described below. Transistors Q3 and Q6 of the differential amplifier stage 11' and transistors Q13 and Q10 of current sum branch 13' are cascode transistors.

P-channel output transistor Q29 is controlled by second differential amplifier stage 15' and associated current sum branch 17' which provide an output control signal to the gate of transistor Q29 at gate node p7. Differential amplifier stage 15' includes a pair of gate connected n-channel differential transistors Q14 and Q21, a pair of gate connected cascode n-channel transistors Q15 and Q20 respectively source/drain connected to transistors Q14, Q21 a pair of p-channel input differential transistors Q16 and Q19, respectively receiving differential inputs vn and vp, and which are respectively connected to transistors Q15, Q20 and which have commonly connected source drain terminals which are in turn commonly connected to commonly connected source/drain terminals of p-channel transistors Q17 and Q18. Differential transistors Q14 and Q21, cascode transistors Q15 and Q20, differential input p-channel transistors Q16 and Q19, and p-channel transistors Q17 and Q18 are serially connected as illustrated across voltage supply terminals 23 and 25. The commonly connected gates of transistors Q14, Q21 are connected to the interconnection of transistors Q15 and Q16, and also provide a dynamic bias point at node n5. The gate connected transistors Q15, Q20 receive a fixed bias at gate node n4.

The current sum branch 17' includes n-channel transistors Q22, Q23 and Q24, which are serially connected through source/drain connections and further serially connected to serially source/drain connected p-channel transistors Q25 and Q26. The entire current sum branch 17', including serially connected transistors Q22, Q23, Q24, Q25, Q26, is connected across voltage source terminals 23 and 25.

The interconnection of the transistors Q24 and Q23 is connected in turn to the interconnection of transistors Q20 and Q19 in the second differential amplifier stage 15'. The gate of transistor Q26 is connected to the gate of transistor Q18 in the second differential amplifier stage 15' and those gates are in turn commonly connected to the interconnection between p-channel transistor Q25 and n-channel transistor Q24. The second differential amplifier stage 15' further includes a fixed bias node p6 at the gate of transistor Q17. P-channel input transistors Q16 and Q19 receive the same input signals vn, vp as do the n-channel transistors Q2 and Q7 of first differential amplifier stage 11'. N-channel transistors Q22 and Q23 of current sum branch 17' receive respective fixed biases on their gate nodes n6, n7. The gate node p8 of transistor Q25 of current sum branch 17 receives a dynamic bias from a p-channel dynamic bias circuit 29 as described in further detail below.

The p-channel output transistor Q30 receives a gate input p7 control signal which originates at the gate connection node between p-channel transistor Q18 from second differential amplifier stage 15' and p-channel transistor Q26 of the current sum branch 17'.

The cascode n-channel transistor Q28 in the output stage 19' receives a dynamic bias input at node n3 from an n-channel dynamic bias circuit 27. This circuit includes an n-channel transistor Q32 having one of its source drain terminals connected to its gate at node n3, and a pair of parallel connected p-channel transistors Q31 and Q33, which are serially connected to n-channel transistor Q32. The serial connection of n-channel transistor Q32 and the parallel p-channel transistors Q31 and Q33 is in turn connected across source voltage terminals 23 and 25. The n3 node of n-channel dynamic bias circuit 27 provides the input gate bias for cascode n-channel transistor Q28 of the output stage 19'.

The cascode p-channel transistor Q29 of the output stage 19' is dynamically biased by a p-channel dynamic bias circuit 29. The p-channel dynamic bias circuit 29 includes p-channel transistor Q34 having one of its source drain terminals connected to its gate, which is serially connected to a pair of parallel connected n-channel transistors Q35 and Q36. The serial connection of p-channel transistor Q34 with parallel connected n-channel transistors Q35 and Q36 is in turn connected across source voltage terminals 23 and 25. The gate node p8 of p-channel transistor Q34 in turn supplies the dynamic bias for the gate of output stage 19' cascode transistor Q29.

The addition of cascode transistors Q29 and Q28 in the output stage 19' provides amplifier 51' with an improved open loop gain response, as well as lower noise immunity to spurious noise introduced from the power supply supplied across terminals 23 and 25.

Additional noise immunity in the amplifier is provided by the cascode transistors which are also provided in the first differential amplifier stage 11' as Q3 and Q6; in the current sum branch 13' as Q12 and Q10; in the second differential amplifier stage 15' as n-channel transistors Q15 and Q20; and in current sum branch 17' as transistors Q25 and Q23.

P-channel dynamic bias circuit 29 has two bias points respectively at the gates of n-channel transistors Q35 and Q36. The gate bias node n1 for transistor Q36 is a fixed bias, while the gate bias to Q35 comes from node n5 which is the gate connection between transistors Q14 and Q21 of second differential amplifier stage 15'.

N-channel dynamic bias circuit 27 has two bias points respectively at the gates of p-channel transistors Q31 and Q33. The node p6 at the gate of p-channel transistor Q33 is a fixed bias node. The gate node p2 of p-channel channel transistor Q31 is dynamically biased by the gate interconnected gate node p2 in first differential amplifier stage 11'.

Each of the p-channel and n-channel dynamic bias circuits 29 and 27 receives a fixed bias input and a bias input which comes from first differential amplifier stage 11', for the n-channel dynamic bias stage 27, and second differential amplifier stage 15' for the p-channel dynamic bias circuit 29. Accordingly, as the first differential stage 11' operates to increase or decrease the bias to output transistor Q27 at node n2, it likewise supplies a bias signal to n-channel dynamic bias circuit 27 at transistor Q31 which in turn causes n3 likewise to increase or decrease, which increases or decreases the bias on the gate of cascode transistor 28. As a consequence, the gate bias on both transistors Q27 and Q28 rise and fall at the same time. Likewise, as the differential amplifier stage 15' increases or decreases the output signal at node p7 to the gate of transistor Q30 to control the output of p-channel transistor Q30, the p-channel dynamic bias circuit 29 receives a bias signal at gate n5 which causes node p8 at the gate of Q34 to supply a bias signal to the cascode transistor Q29. Accordingly, as the gate bias on output transistor Q30 rises or falls, so does the gate bias of cascode transistor Q29.

The operation of the FIG. 3 circuit in biasing the output transistors Q30 and Q27, as well as cascode transistors Q28 and Q29 will now be explained with reference to current paths identified in FIG. 3 as Path 0 through Path 5. Operation of the FIG. 3 amplifier 51' will be described in connection with its use to supply a bias voltage to capacitors 43, 45 in the FIG. 2 circuit. The output terminal 21 of amplifier 51' is fed back as the input vn to the differential amplifier stages 11', 13', and the input vp to both differential amplifier stages is tied to a reference voltage source.

When the inputs vn, vp to the differential amplifier stages 11' and 15' move from steady state, where vn=vp, the amplifier 51' operates as follows. Current Paths 0, 1 and 2 are operative when vn>vp. In this case, when vn>vp, more current will flow through Path 0. Since Q4 is diode connected, it will mirror this current onto Q5. Since Q7 cannot handle this increase in current, the excess current will flow into the current sum branch Path 1. This excess current is reflected to the output through node n2 which has its voltage increased. At the same time that the current in Path 0 increases, it also causes the voltage on node p2 to reduce. This drop in voltage will cause the current in path 2 to increase, and this will also cause the voltage n3 to increase, ensuring that transistors Q9 and Q32 stay in saturation and the differential amplifier employed in first differential amplifier stage 11' works well. It is noted that current paths Path 0 and 1 ensure high current gain for the output, and current Path 2 ensures that the voltage for the cascode n-channel transistor Q28 is correctly biased during amplifier transition periods.

Current Paths 3, 4 and 5 are operative when the differential amplifier inputs have the signals vn≦vp. When vn≦vp, more current flows through Path 3. Since Q14 is diode connected, Q1 will draw more current. This causes an increase in current through Path 4. This excess current is reflected to the output through node p7 which biases the output transistor Q30. At the same time that the current through Path 3 increases, and the voltage n5 increases. This increase in the voltage at n5 will cause the current in Path 5 to increase, ensuring that transistors Q29 and Q25 remain in a saturation region. Current Paths 3 and 4 ensure high current gain for the output, and Path 2 ensures that the cascode voltage for the cascode p-channel transistor Q29 is correctly biased during transition periods.

The invention also includes the fabrication of the FIG. 3 circuit as an integrated circuit in which all stages of the amplifier 51' described above are fabricated on a semiconductor substrate.

Figure 1:
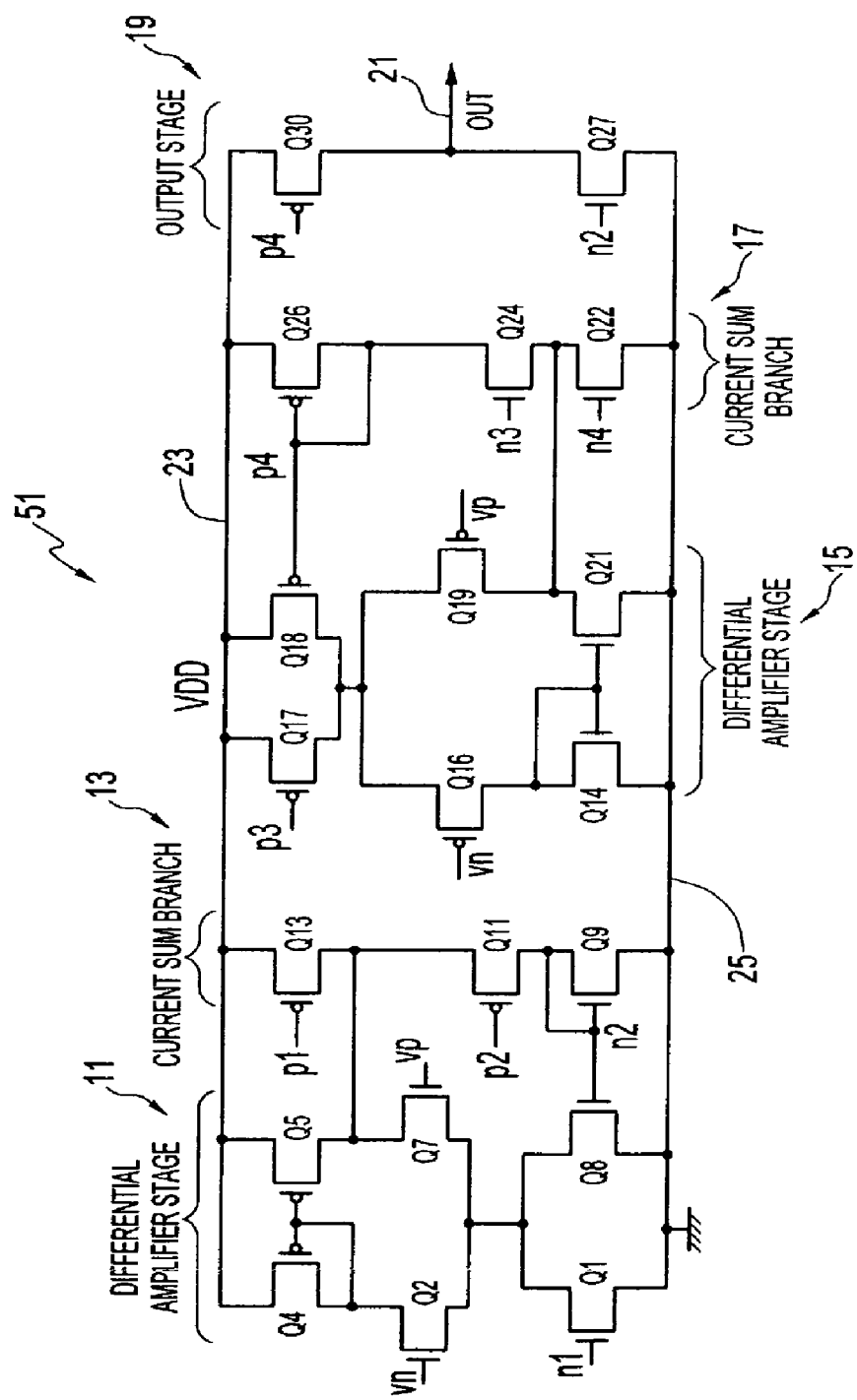
FIG. 1 is a schematic diagram of a conventional class AB amplifier.
Figure 2:
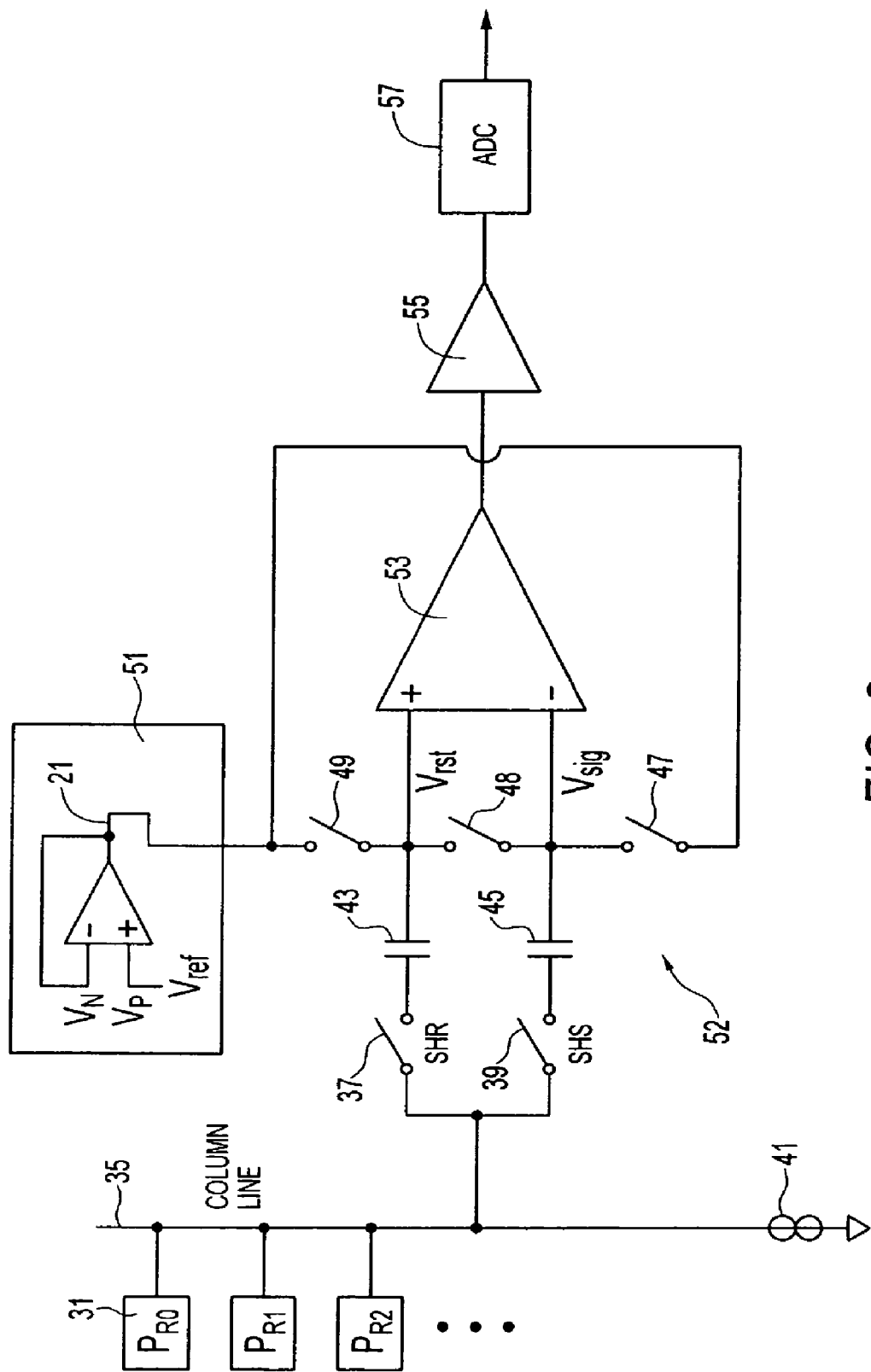
FIG. 2 is a schematic diagram of one possible use for a class AB amplifier in the sample-and-hold stage of a solid state imager device circuit.

As noted, one particular utility for the FIG. 3 class AB amplifier is as a replacement for amplifier 51 illustrated in FIG. 2 which provides a bias voltage to capacitors 43 and 45 through respective switches 49 and 47 in the sample-and-hold circuit 52. These switches are operative prior to Vrst and Vsig being sampled on the capacitors through switches 37 and 39.

Figure 4:
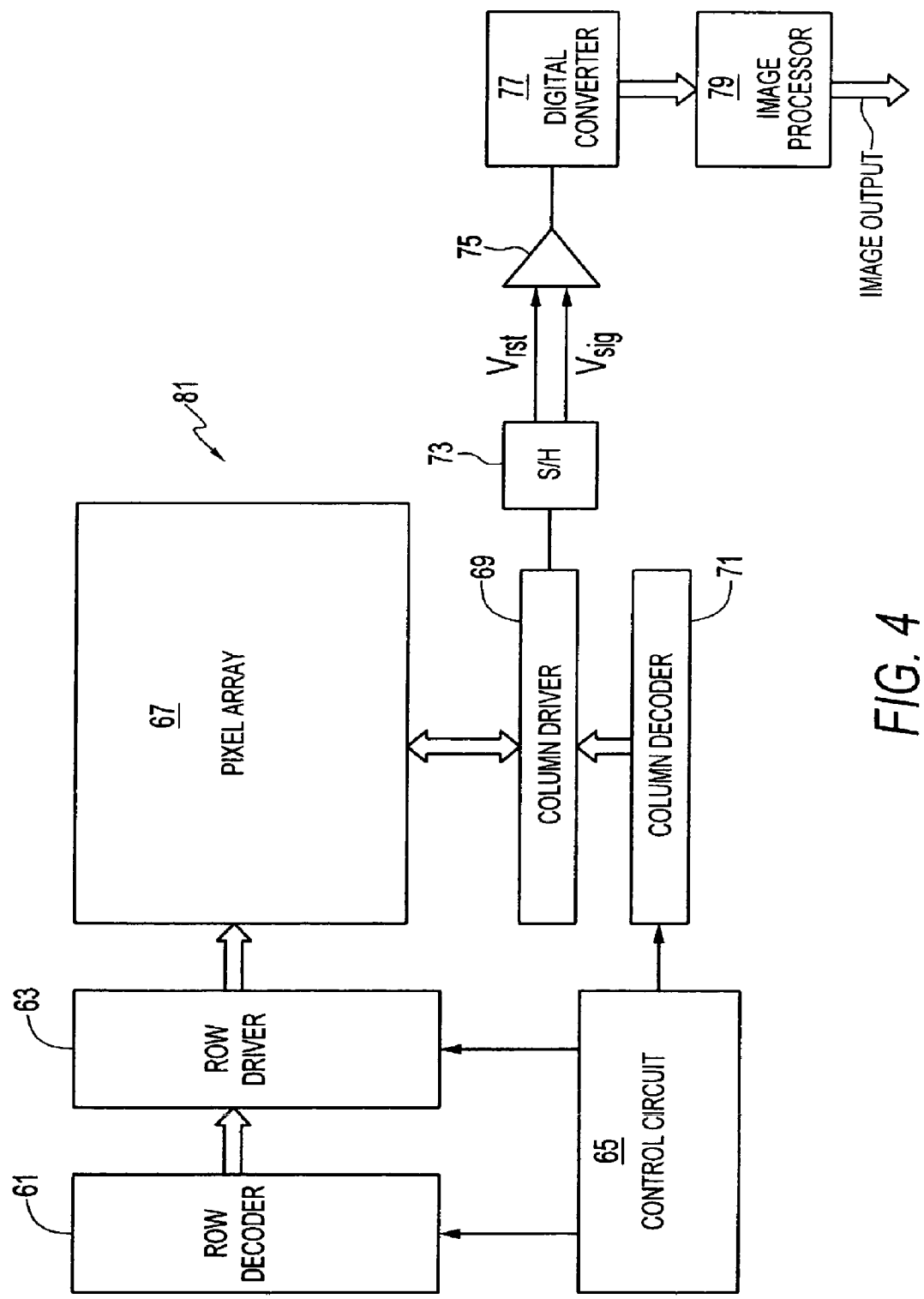
FIG. 4 is an imager device which employs the FIG. 3 embodiment of the invention.

The sample-and-hold circuit of FIG. 2 employing the class AB amplifier 51' illustrated in an exemplary embodiment in FIG. 3 may be used in an imager device 81 depicted in FIG. 4 and may be fabricated on the same substrate on which imager device 81 is also fabricated. The CMOS imager 81 has a pixel array 67, the readout of which is operated by a control circuit 65, which controls address row and column decoders 61, 71 for selecting the appropriate row and column lines for pixel readout. Control circuit 65 also controls the row and column driver circuitry 63, 69 so that they apply driving voltages to the drive transistors of the selected row and column lines. As noted, the pixel output signals include a pixel reset signal Vrst, readout of a pixel floating diffusion region, after it is reset by a reset transistor and a pixel image signal Vsig, which is read out of the floating diffusion region after photo-generated charges are transferred there. For each pixel, the Vrst and Vsig signals are sampled by the sample-and-hold circuit 73 and are subtracted by a differential amplifier 75, to produce a differential signal Vrst−Vsig representing the amount of light impinging on the pixels. This difference signal is digitized by an analog-to-digital converter 77. The digitized pixel signals are fed to an image processor 79 to form a digital image output. The digitizing and image processing can be located on or off the imager device 81 chip. In some arrangements the differential signal Vrst−Vsig may be amplified as a differential signal and directly digitized by a differential analog-to-digital converter.

Figure 5:
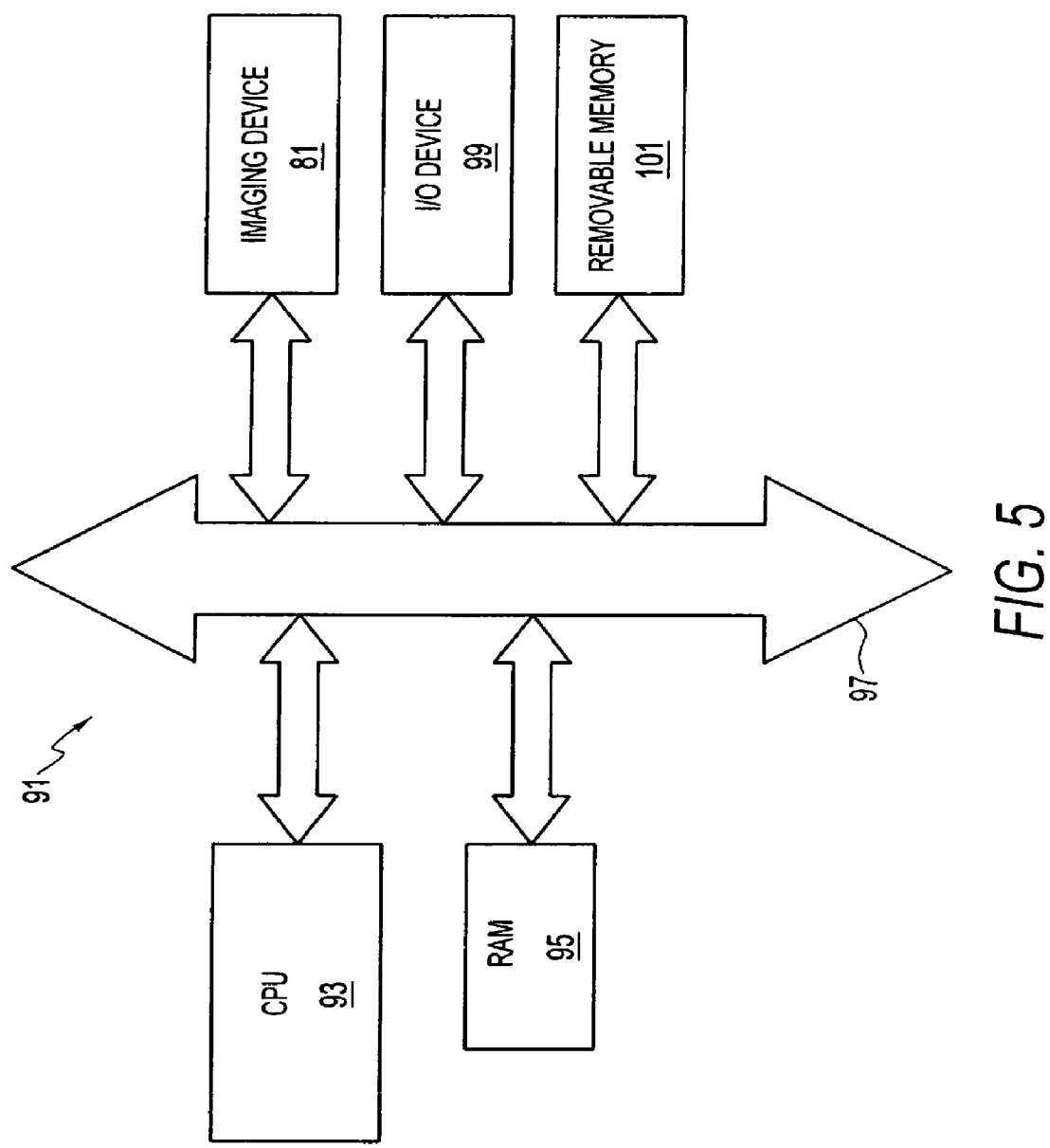
FIG. 5 is a processing system which employs the imager device of FIG. 4.

FIG. 5 illustrates an imaging processor system 91, for example a camera system, scanning system, or any other type of system for processing images acquired by an imager device, such as imager device 81. Processor system 91 comprises a central processing unit (CPU) 93, such as a microprocessor, that communicates with an input/output (I/O) device 99 over one or more buses 97. The system 91 also includes an imaging device 81 which may be constructed in accordance with FIG. 4 and employ the amplifier 51' described herein. Imager 81 also communicates with the CPU 93 over one or more buses 97. The processor system 91 also includes random access memory (RAM) 95, and can include removable memory 101 such as flash memory, which also communicate with CPU 91, over one or more buses 97. Imager 81 may be combined with a processor 93, such as a CPU, digital signal processor, or microprocessor, with or without memory storage on a single integrated circuit or on a different chip than the processor.

While exemplary embodiments of the invention have been described and illustrated above, modifications can be made thereto without departing from the spirit and scope of the invention. For example, additional n-channel or p-channel cascode transistors may be provided in the output stage 19', or in the differential amplifier stages 11', 15', the current sum branches 13', 17', or in the dynamic bias circuits 27, 29. Also, the amplifier 51' may be used in many other circuit environments than that described above. Accordingly, the foregoing description is only to be considered as exemplifying the invention and as not limiting thereof in any way. The invention is only limited by the scope of the claims which are attached hereto.

What is claimed as new and desired to be protected by Letters Patent of the United States is:

1. An amplifier comprising:
 a pair of power supply terminals for receiving a supply voltage;
 an output stage having a pair of n-channel and p-channel output transistors, and a pair of cascode n-channel and p-channel transistors, said n-channel transistors being connected in series and said p-channel transistors being connected in series, and said serially connected n-channel transistors being serially connected to said serially connected p-channel transistors;

an output node in said output stage at an interconnection between said n-channel and p-channel output transistors;

a first differential amplifier stage and associated first current path stage, both connected across said power supply terminals, for biasing said n-channel output transistor;

a second differential amplifier stage and associated second current path stage, both connected across said power supply terminals for biasing said p-channel output transistor;

a first dynamic bias circuit coupled across said power supply terminals for biasing said n-channel cascode transistor; and a second dynamic bias circuit coupled across said power supply terminals for biasing said p-channel cascode transistor, wherein said first dynamic bias stage comprises a pair of p-channel transistors having sources and drains connected in parallel and a diode connected n-channel transistor connected in series with said pair of p-channel transistors, a gate connection of said n-channel transistor providing bias to a gate of said output stage n-channel cascode transistor.

2. The amplifier defined in claim 1, wherein a gate of one of said pair of p-channel transistors is connected to a bias point of said first differential amplifier stage and a gate of the other of said pair of p-channel transistors is connected to receive a bias potential applied to said second differential amplifier stage.

3. The amplifier defined in claim 1, wherein said first differential amplifier stage and associated first current path stage, and said first dynamic bias stage are configured such that as the gate bias on the n-channel output transistor increases, the gate bias on the n-channel cascode transistor also increases.

4. An amplifier comprising:
a pair of power supply terminals for receiving a supply voltage;

an output stage having a pair of n-channel and p-channel output transistors, and a pair of cascode n-channel and p-channel transistors, said n-channel transistors being connected in series and said p-channel transistors being connected in series, and said serially connected n-channel transistors being serially connected to said serially connected p-channel transistors;

an output node in said output stage at an interconnection between said n-channel and p-channel output transistors;

a first differential amplifier stage and associated first current path stage, both connected across said power supply terminals, for biasing said n channel output transistor;

a second differential amplifier stage and associated second current path stage, both connected across said power supply terminals for biasing said p-channel output transistor;

a first dynamic bias circuit coupled across said power supply terminals for biasing said n-channel cascode transistor; and a second dynamic bias circuit coupled across said power supply terminals for biasing said p-channel cascode transistor, wherein said second dynamic bias stage comprises a pair of n-channel transistors having source and drains connected in parallel and a diode connected p-channel transistor connected in series with said pair of n-channel transistors, a gate connection of said p-channel transistor providing bias to a gate of said output stage p-channel cascode transistor.

5. The amplifier defined in claim 4, wherein a gate of one of said pair of n-channel transistors is connected to a bias point of said second differential amplifier stage and a gate of the other of said n-channel transistors is connected to receive a bias potential applied to said first differential amplifier stage.

6. The amplifier defined in claim 4, wherein said second differential amplifier stage and associated second current path stage, and said second dynamic bias stage are configured such that as the gate bias on the p-channel output transistor increases, the gate bias on the p-channel cascode transistor also increases.

7. An amplifier comprising:
a pair of power supply terminals for receiving a supply voltage;

an output stage having a pair of n-channel and p-channel output transistors, and a pair of cascode n-channel and p-channel transistors, said n-channel transistors being connected in series and said p-channel transistors being connected in series, and said serially connected n-channel transistors being serially connected to said serially connected p-channel transistors;

an output node in said output stage at an interconnection between said n-channel and p-channel output transistors;

a first differential amplifier stage and associated first current path stage, both connected across said power supply terminals, for biasing said n channel output transistor;

a second differential amplifier stage and associated second current path stage, both connected across said power supply terminals for biasing said p-channel output transistor;

a first dynamic bias circuit coupled across said power supply terminals for biasing said n-channel cascode transistor; and a second dynamic bias circuit coupled across said power supply terminals for biasing said p-channel cascode transistor, wherein said first differential amplifier stage comprises a differential amplifier circuit which includes cascode transistors.

8. The amplifier defined in claim 7, wherein at least one of said cascode transistors of said first differential amplifier state is dynamically biased.

9. An amplifier comprising:
a pair of power supply terminals for receiving a supply voltage;

an output stage having a pair of n-channel and p-channel output transistors, and a pair of cascode n-channel and p-channel transistors, said n-channel transistors being connected in series and said p-channel transistors being connected in series, and said serially connected n-channel transistors being serially connected to said serially connected p-channel transistors;

an output node in said output stage at an interconnection between said n-channel and p-channel output transistors;

a first differential amplifier stage and associated first current path stage, both connected across said power supply terminals, for biasing said n channel output transistor;

a second differential amplifier stage and associated second current path stage, both connected across said power supply terminals for biasing said p-channel output transistor;

a first dynamic bias circuit coupled across said power supply terminals for biasing said n-channel cascode transistor; and a second dynamic bias circuit coupled across said power supply terminals for biasing said p-channel cascode transistor, wherein said second differential amplifier stage comprises a differential amplifier circuit which includes cascode transistors.

10. The amplifier defined in claim 9, wherein at least one of said cascode transistors of said first differential amplifier state is dynamically biased.

11. An amplifier comprising:

a pair of power supply terminals for receiving a supply voltage;

an output stage having a pair of n-channel and p-channel output transistors, and a pair of cascode n-channel and p-channel transistors, said n-channel transistors being connected in series and said p-channel transistors being connected in series, and said serially connected n-channel transistors being serially connected to said serially connected p-channel transistors;

an output node in said output stage at an interconnection between said n-channel and p-channel output transistors;

a first differential amplifier stage and associated first current path stage, both connected across said power supply terminals, for biasing said n channel output transistor;

a second differential amplifier stage and associated second current path stage, both connected across said power supply terminals for biasing said p-channel output transistor;

a first dynamic bias circuit coupled across said power supply terminals for biasing said n-channel cascode transistor; and a second dynamic bias circuit coupled across said power supply terminals for biasing said p-channel cascode transistor, wherein said first current path stage includes cascode transistors.

12. An amplifier comprising:

a pair of power supply terminals for receiving a supply voltage;

an output stage having a pair of n-channel and p-channel output transistors, and a pair of cascode n-channel and p-channel transistors, said n-channel transistors being connected in series and said p-channel transistors being connected in series, and said serially connected n-channel transistors being serially connected to said serially connected p-channel transistors;

an output node in said output stage at an interconnection between said n-channel and p-channel output transistors;

a first differential amplifier stage and associated first current path stage, both connected across said power supply terminals, for biasing said n channel output transistor;

a second differential amplifier stage and associated second current path stage, both connected across said power supply terminals for biasing said p-channel output transistor;

a first dynamic bias circuit coupled across said power supply terminals for biasing said n-channel cascode transistor; and a second dynamic bias circuit coupled across said power supply terminals for biasing said p-channel cascode transistor, wherein said second current path stage includes cascode transistors.

* * * * *